United States Patent
Yamasaka

(10) Patent No.: US 11,322,512 B2
(45) Date of Patent: May 3, 2022

(54) SEMICONDUCTOR DEVICE AND METHOD FOR MANUFACTURING THE SAME

(71) Applicant: Kioxia Corporation, Tokyo (JP)

(72) Inventor: Shuto Yamasaka, Mie Mie (JP)

(73) Assignee: KIOXIA CORPORATION, Tokyo (JP)

(*) Notice: Subject to any disclaimer, the term of this patent is extended or adjusted under 35 U.S.C. 154(b) by 4 days.

(21) Appl. No.: 16/290,849

(22) Filed: Mar. 1, 2019

(65) Prior Publication Data
US 2019/0371814 A1 Dec. 5, 2019

(30) Foreign Application Priority Data
May 29, 2018 (JP) .............................. JP2018-102570

(51) Int. Cl.
*H01L 27/11582* (2017.01)
*H01L 21/28* (2006.01)

(52) U.S. Cl.
CPC .. *H01L 27/11582* (2013.01); *H01L 29/40117* (2019.08)

(58) Field of Classification Search
CPC .................. H01L 29/40117; H01L 27/1582
See application file for complete search history.

(56) References Cited

U.S. PATENT DOCUMENTS

| | | | |
|---|---|---|---|
| 8,624,316 B2 | 1/2014 | Mizushima et al. | |
| 8,759,901 B2 | 6/2014 | Higuchi et al. | |
| 10,153,262 B2* | 12/2018 | Isogai | H01L 29/40117 |
| 10,269,825 B2* | 4/2019 | Wakatsuki | H01L 27/11582 |
| 2008/0105915 A1* | 5/2008 | Park | H01L 29/66825 |
| | | | 257/314 |
| 2016/0118396 A1* | 4/2016 | Rabkin | H01L 21/0217 |
| | | | 257/314 |
| 2016/0343657 A1* | 11/2016 | Sawa | H01L 29/40117 |
| 2018/0269196 A1* | 9/2018 | Isogai | H01L 27/11521 |

FOREIGN PATENT DOCUMENTS

JP 2012-174907 A 9/2012

* cited by examiner

*Primary Examiner* — Latanya N Crawford Eason
(74) *Attorney, Agent, or Firm* — Foley & Lardner LLP

(57) ABSTRACT

A semiconductor device including a stacked body that includes insulating layers and conductive layers that are alternately stacked, a first film provided inside a recess portion that penetrates through the stacked body, a second film provided on a surface of the first film, a third film provided on a surface of the second film, and a fourth film provided on a surface of the third film. An average concentration of a halogen element per unit area in the third film and the fourth film is lower than an average concentration of the halogen element per unit area at an interface between the third film and the fourth film.

9 Claims, 18 Drawing Sheets

SEMICONDUCTOR DEVICE AND METHOD FOR MANUFACTURING THE SAME

CROSS-REFERENCE TO RELATED APPLICATION

This application claims the benefit of and priority to Japanese Patent Application No. 2018-102570, filed May 29, 2018, the entire contents of which are incorporated herein by reference.

FIELD

Embodiments described herein relate generally to a semiconductor device and a method for manufacturing the same.

BACKGROUND

Examples of semiconductor devices include three-dimensional semiconductor memory. The three-dimensional semiconductor memory may include a stacked body in which insulating layers and conductive layers are alternately stacked. Moreover, memory holes penetrate through the stacked body. In each of the memory holes, for example, a block insulating film, a charge storage layer, a tunnel insulating film, and a channel are formed.

DETAILED DESCRIPTION

In some three-dimensional semiconductor memory, if crystal defects occur at an interface between a tunnel insulating film and a channel, the channel resistance may increase, such that electron mobility decreases.

Embodiments described herein provide for a semiconductor device capable of ameliorating a decrease in electron mobility and a method for manufacturing the same.

In general, according to one embodiment, a semiconductor device includes a stacked body in which insulating layers and conductive layers are alternately stacked, a first film is provided inside a recess portion that penetrates through the stacked body, a second film is provided on a surface of the first film, a third film provided on a surface of the second film, and a fourth film is provided on a surface of the third film. An average concentration of a halogen element per unit area in the third film and the fourth film is lower than an average concentration of the halogen element per unit area at an interface between the third film and the fourth film.

Hereinafter, embodiments of the present disclosure will be described with reference to the drawings. The embodiments are not intended to limit the present disclosure.

First Embodiment

Figure 1:
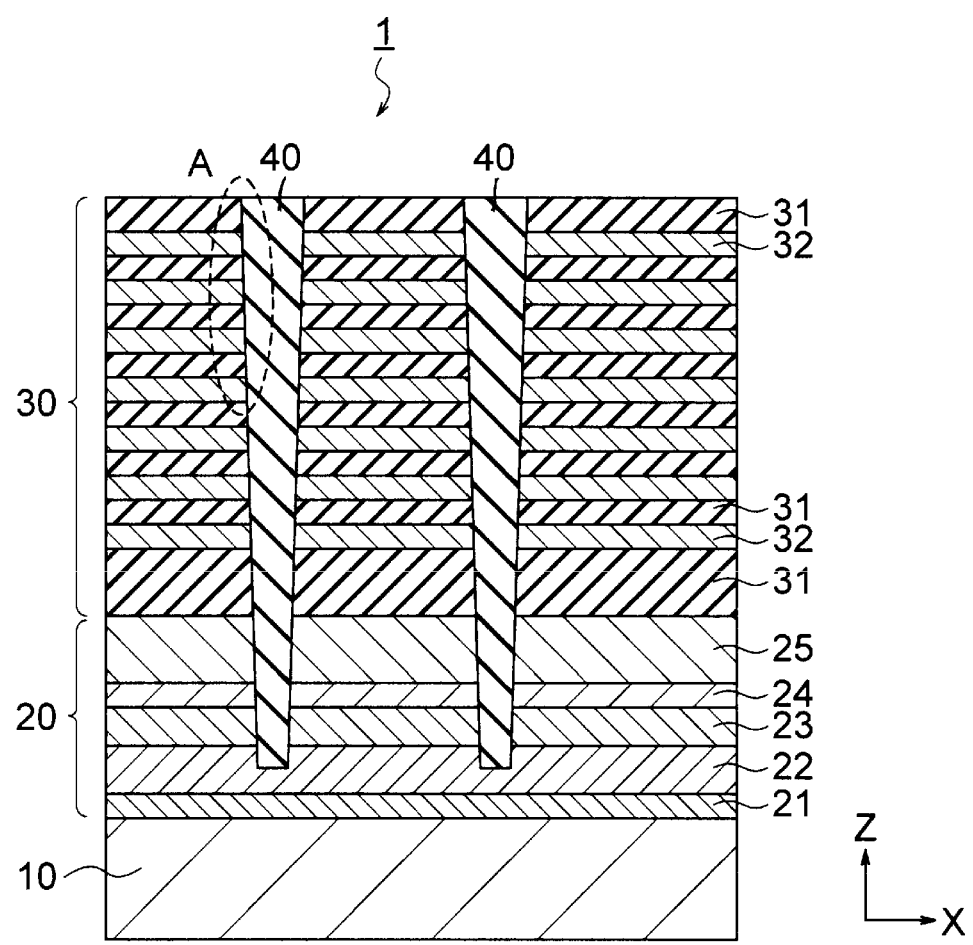
FIG. 1 is a sectional view of a semiconductor device according to a first embodiment.

FIG. 1 is a sectional view of a semiconductor device according to a first embodiment. The semiconductor device 1 illustrated in FIG. 1 is a three-dimensional semiconductor memory. The semiconductor device 1 includes a substrate 10, an under layer 20, a stacked body 30, and memory cell films 40.

The substrate 10 includes, for example, a silicon substrate. Furthermore, the substrate 10 may include, for example, a transistor (not illustrated) and an electrode (not illustrated), which is used to drive the transistor, formed therein. Hereinafter, in some cases, a direction parallel to the substrate 10 is referred to an "X-direction" and a direction perpendicular to the substrate 10 is referred to a "Z-direction".

The under layer 20 functions as an interconnection used for supplying electricity to the memory cell films 40. A metal source line 21 is included in the under layer 20 and is provided on the substrate 10. A phosphorus (P)-doped polysilicon layer 22 is included in the under layer 20 and is provided on the metal source line 21. A non-doped polysilicon layer 23 is included in the under layer 20 and is provided on the phosphorus-doped polysilicon layer 22. A non-doped polysilicon layer 24 is included in the under layer 20 and is provided on the non-doped polysilicon layer 23. A phosphorus-doped polysilicon layer 25 is included in the under layer 20 and is provided on the non-doped polysilicon layer 24. In some embodiments, an impurity other than phosphorus may be implemented.

The stacked body 30 is provided on the phosphorus-doped polysilicon layer 25. Furthermore, in some embodiments, the under layer 20 may be omitted, and the stacked body 30 may be provided directly on the substrate 10. Insulating layers 31 and conductive layers 32 are included in the stacked body 30 and are alternately stacked in layers along the Z-direction. The insulating layers 31 include, for example, silicon nitride ($SiO_2$). Moreover, the conductive layers 32 include, for example, a metal such as tungsten (W). The conductive layers 32 function as electrodes for the memory cell film 40.

The memory cell film 40 penetrates through the stacked body 30, and a bottom portion thereof reaches the phosphorus-doped polysilicon layer 22 (and, for example, contacts the phosphorus-doped polysilicon layer 22, and may be embedded in the phosphorus-doped polysilicon layer 22). While, in FIG. 1, two memory cell films 40 are arranged side by side along the X-direction, the number of memory cell films 40 is not so limited. A cross-section structure of the memory cell film 40 is described with reference to FIG. 2.

Figure 2:
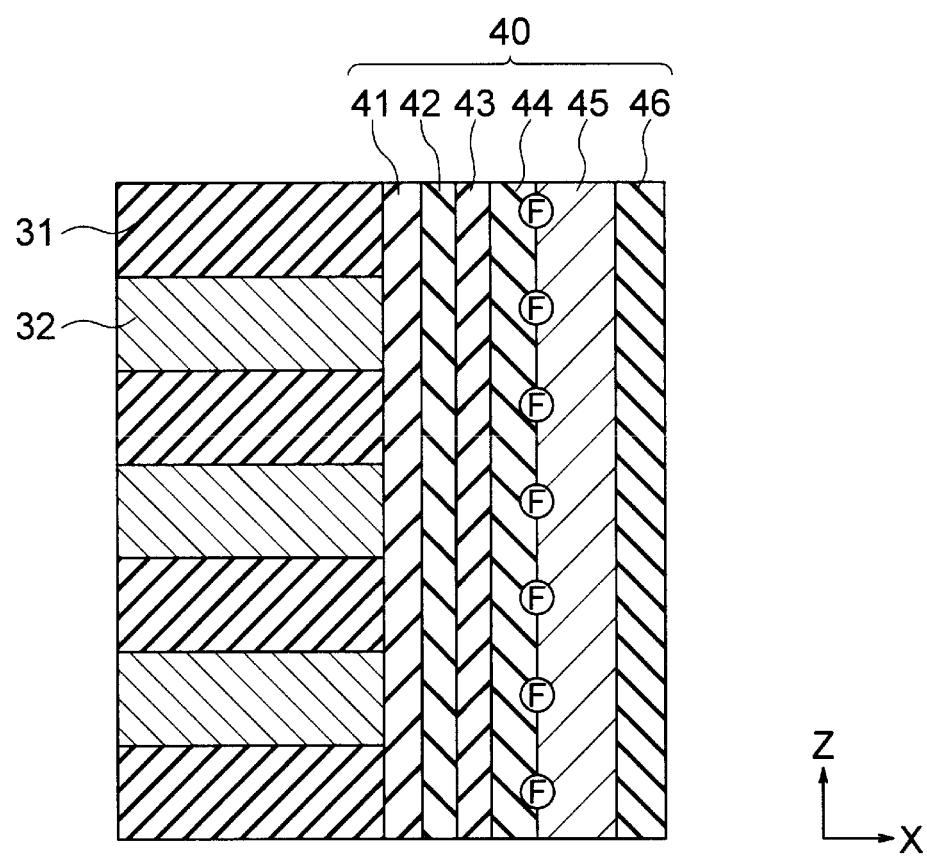
FIG. 2 is a sectional view obtained by enlarging a region A illustrated in FIG. 1.

FIG. 2 is a sectional view obtained by enlarging a region A illustrated in FIG. 1. As illustrated in FIG. 2, the memory cell film 40 includes a block film 41, a charge storage layer 42, tunnel insulating films 43 and 44, a channel 45, and a core 46.

The block film 41 is an example of a first film and may include a first silicon oxide film. In some embodiments, the block film 41 may be a stacked film configured with a silicon oxide film and a high-k film. The block film 41 is in contact with each of the insulating layers 31 and the conductive layers 32, which may define an inner circumferential surface of a memory hole, described below.

The charge storage layer 42 is an example of a second film and can include a silicon nitride film (SiN). The charge storage layer 42 is provided on the surface of the block film 41, such as the inner circumferential surface thereof.

The tunnel insulating films 43 and 44 are an example of a third film. The tunnel insulating film 43 includes a silicon oxynitride film (SiON) on a surface of the charge storage layer 42, such as the inner circumferential surface thereof. Moreover, the tunnel insulating film 44 includes a second silicon oxide film on a surface of the silicon oxynitride film. Furthermore, while, in the present embodiment, two layers of tunnel insulating films are implemented (e.g., to improve the injection efficiency of electrons and holes), a single layer of tunnel insulating film may be implemented in some embodiments.

The channel 45 is an example of a fourth film that can include polysilicon. Supplying electricity to the channel 45 causes a channel to be formed at an interface between the channel 45 and the tunnel insulating film 44. As illustrated in FIG. 2, defect termination elements are embedded in the interface between the channel 45 and the tunnel insulating film 44. The core 46 is provided on the surface of the channel 45. The core 46 includes, for example, a silicon oxide film.

The semiconductor device according to the present embodiment includes defect termination elements embedded in the interface between the channel 45 and the tunnel insulating film 44. Accordingly, even if crystal defects, for example, dangling bonds of silicon atoms, occur at such an interface, the dangling bonds bind to the defect termination elements, so that the crystal defects terminate, thus becoming chemically stable. Thus the defect termination elements may help to contain or limit crystal defects. A defect termination element may include or may be an element capable of covalently bonding with silicon atoms having dangling or available bonds. The defect termination element may include or may be a halogen element such as, for example, fluorine (F) or chlorine (Cl). Hereinafter, in the description of the first and second embodiments, the defect termination element of fluorine will be described as an example.

Hereinafter, a method for manufacturing the semiconductor device 1 according to the present embodiment is described with reference to FIG. 3 to FIG. 7.

Figure 3:
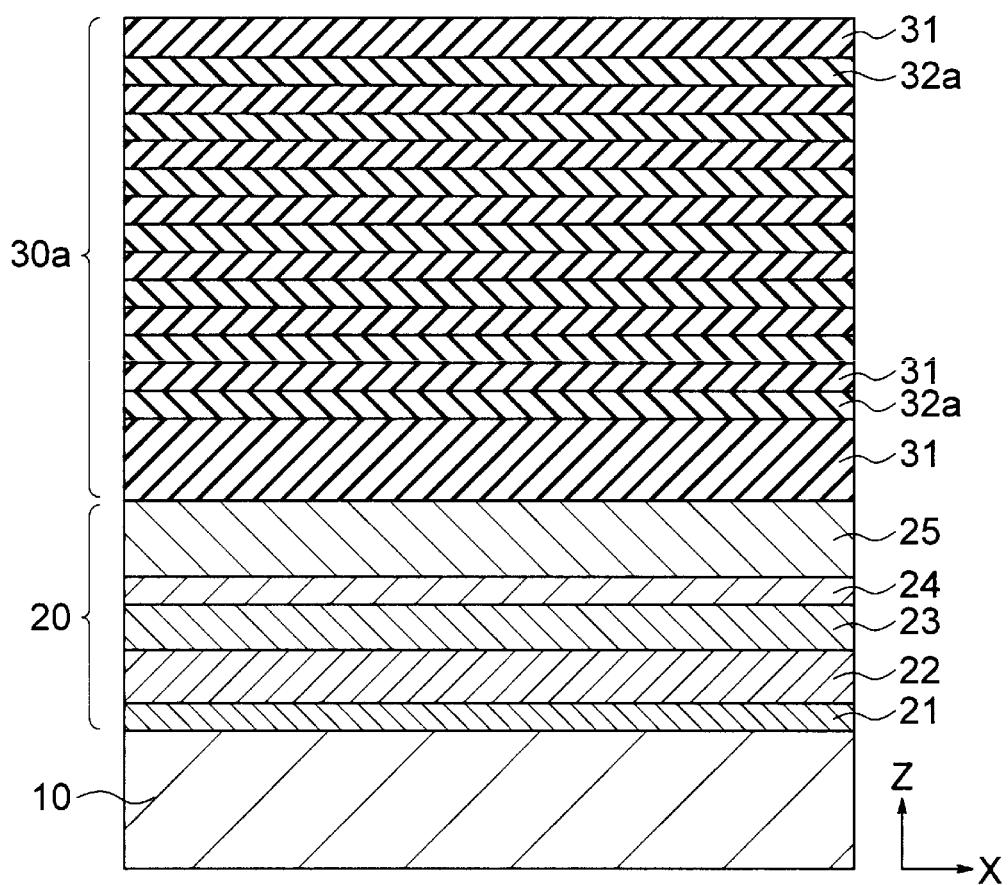
FIG. 3 is a sectional view illustrating a formation process for a stacked body according to some embodiments.

First, as illustrated in FIG. 3, the method includes forming the under layer 20 on the substrate 10, and, next, forming a stacked body 30a on the under layer 20. The stacked body 30a is formed by alternately stacking insulating layers 31 and insulating layers 32a in layers along the Z-direction. The insulating layer 32a includes, for example, silicon nitride. The under layer 20 and the stacked body 30a are formed with use of, for example, a chemical vapor deposition (CVD) method or an atomic layer deposition (ALD) method.

Figure 4:
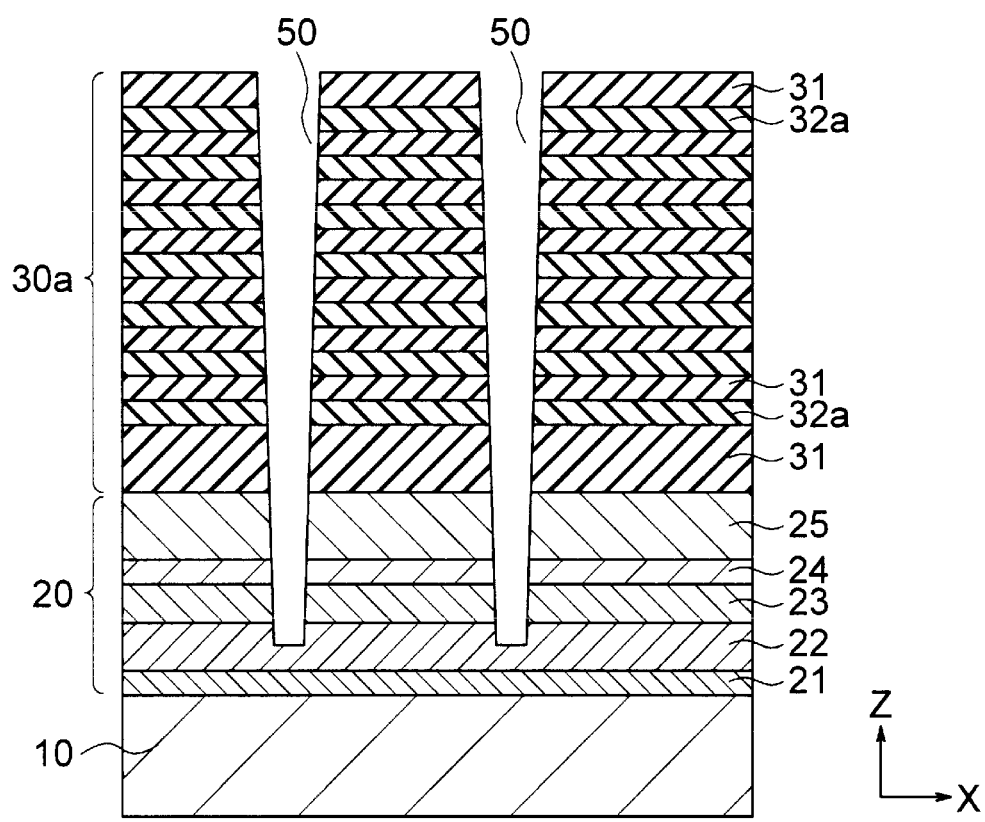
FIG. 4 is a sectional view illustrating a formation process for memory holes according to some embodiments.

Next, as illustrated in FIG. 4, the method includes forming memory holes 50 with use of, for example, a reactive ion etching (RIE) method. The memory hole 50 is an example of a recess portion that penetrates the stacked body 30a. The bottom portion of the memory hole 50 reaches the phosphorus-doped polysilicon layer 22 (and, for example, penetrates the phosphorus-doped polysilicon layer 22).

Figure 5:
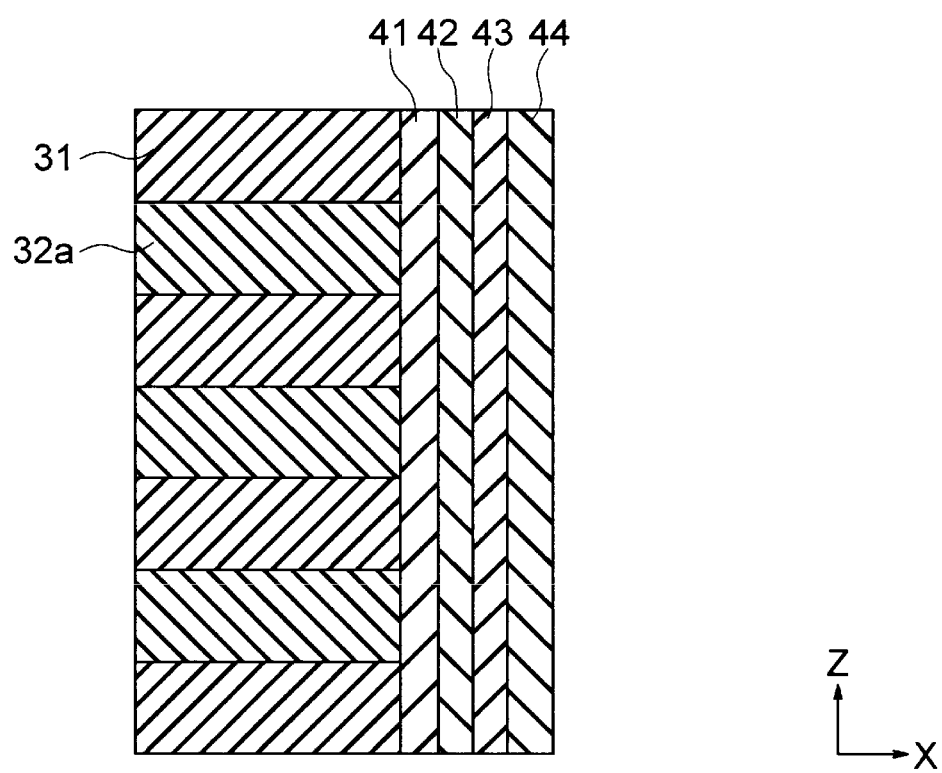
FIG. 5 is a sectional view illustrating at least a portion of a formation process for a memory cell film according to some embodiments.

Next, as illustrated in FIG. 5, the method includes sequentially forming the block film 41, the charge storage layer 42, and the tunnel insulating films 43 and 44 inside the memory hole 50. Each film is formed with use of, for example, the CVD method or the ALD method.

Figure 6:
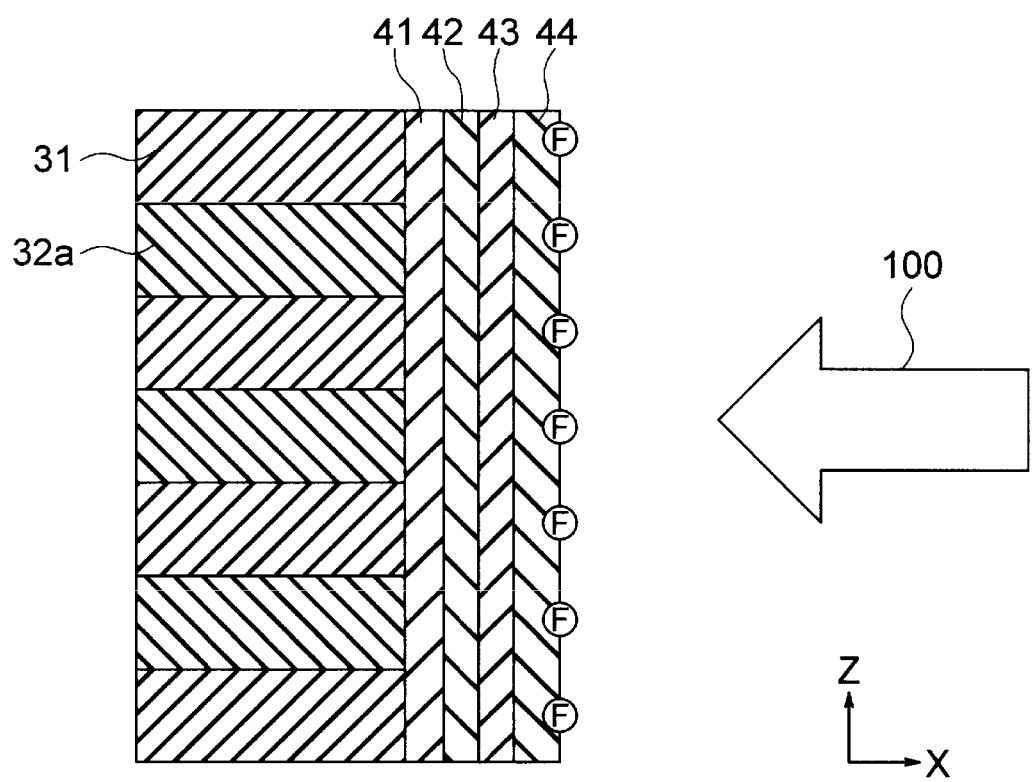
FIG. 6 is a sectional view illustrating an annealing treatment according to some embodiments.

Next, as illustrated in FIG. 6, the method includes performing an annealing treatment using a gas 100 containing fluorine on the tunnel insulating film 44. Examples of the applicable gas 100 include $F_2$ (fluorine) gas, $NF_3$ (nitrogen trifluoride) gas, $SF_6$ (sulfur hexafluoride) gas, $C_4F_6$ (hexafluoro-1,2-butadiene) gas, and $C_4F_8$ (octafluoro-1,2-butene) gas.

In such an annealing treatment, for example, the gas 100 is introduced for about 10 minutes (e.g., in a range of about 9 minutes to about 11 minutes, or in a range of about 8 minutes to about 12 minutes) at a temperature in a range of about 500° C. to about 600° C. Thus fluorine atoms are adsorbed to the tunnel insulating film 44 and/or dispersed to the tunnel insulating film 43.

Figure 7:
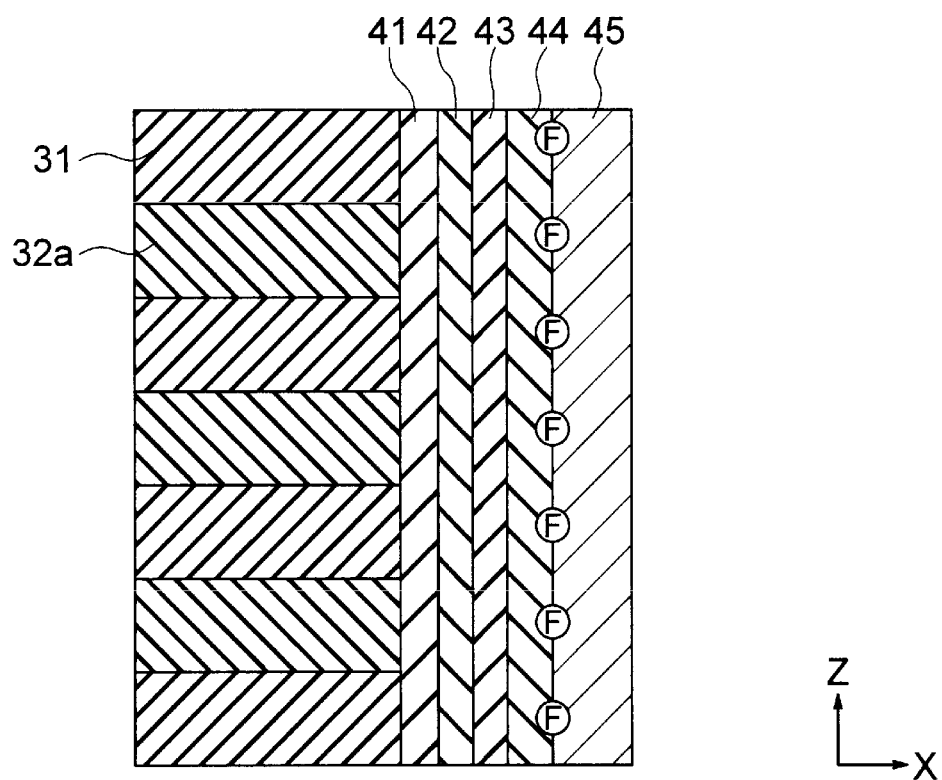
FIG. 7 is a sectional view illustrating a formation process for a channel according to some embodiments.

After the above-mentioned annealing treatment, as illustrated in FIG. 7, the method includes forming the channel 45 on the surface of the tunnel insulating film 44. Next, the method includes forming the core 46 on the surface of the channel 45 to achieve a semiconductor device as illustrated in FIG. 2. The memory hole 50 is thus filled, at least in part, with the memory cell film 40. The channel 45 and the core 46 are formed with use of, for example, the CVD method or the ALD method.

After formation of the core 46, the insulating layers 32a are removed with a high-temperature phosphoric acid solution via, for example, a slit (not illustrated). The removal of the insulating layers 32a may leave gaps or spaces, and the conductive layers 32 are formed at the gaps or spaces with use of, for example, the CVD method or the ALD method. In this way, the insulating layers 32a are replaced by the conductive layers 32.

Figure 8:
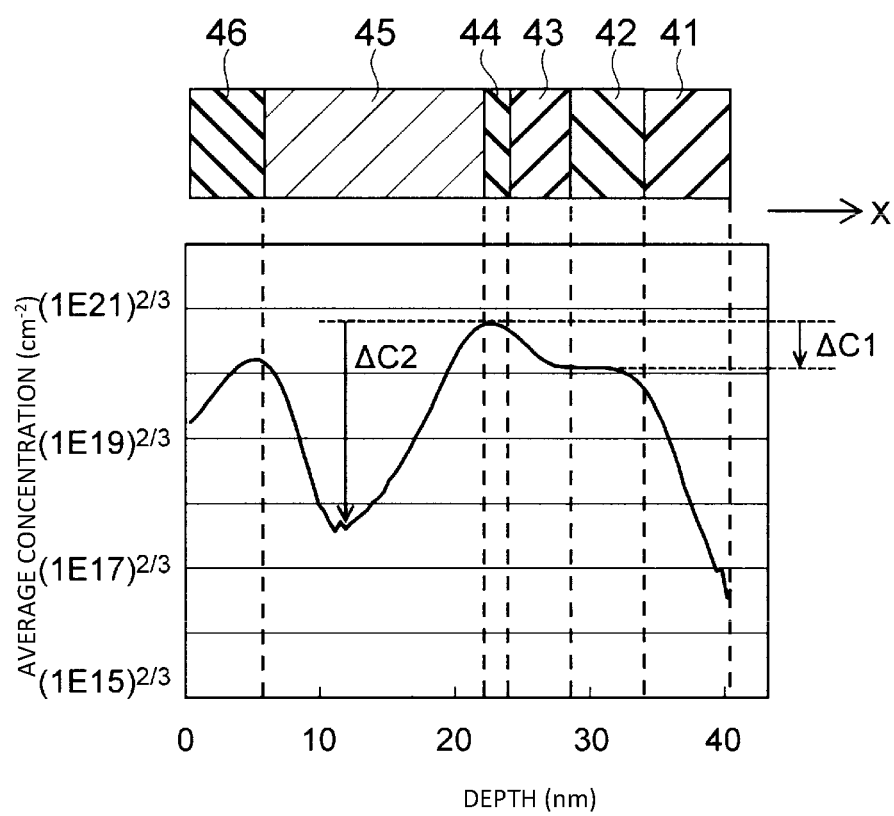
FIG. 8 is a graph illustrating a concentration profile of fluorine in a memory cell film according to the first embodiment.

FIG. 8 is a graph illustrating a concentration profile of fluorine in the memory cell film 40 in the present embodiment. In FIG. 8, the horizontal axis indicates a depth in the X-direction from the core 46 in nanometers (nm), and the vertical axis indicates an average concentration of fluorine per unit area (per centimeter (cm) squared). This concentration profile was obtained by performing an annealing treatment in which a gas including fluorine was introduced for 10 minutes at a temperature of 550° C.

As illustrated in FIG. 8, the average concentration of fluorine becomes higher as the depth comes closer to an interface between the tunnel insulating film 44 and the channel 45. A peak value of the average concentration exists at the interface. Therefore, according to the present embodiment, crystal defects of polysilicon occurring at the interface can be terminated to a significant degree by fluorine. This prevents or reduces an increase in channel resistance, and, therefore, enables ameliorating a decrease in electron mobility in the channel 45.

Moreover, in the present embodiment, the gas 100 is introduced directly to the tunnel insulating films 43 and 44 (e.g., as shown in FIG. 6). The gas 100 may be introduced to the tunnel insulating film 44 exposed on the inside of the memory hole 50. Therefore, with regard to the average concentration of fluorine, an amount of decrease $\Delta C1$ in a direction from the above-mentioned interface to the tunnel insulating films 43 and 44 (e.g., within about 5 to about 15 nanometers from the interface) is smaller than an amount of decrease $\Delta C2$ in a direction from the above-mentioned interface to the channel 45 (e.g., within about 5 to about 15 nanometers from the interface). Referring to FIG. 8, the amount of decrease $\Delta C1$ is less than $(1\times10)^{2/3}$ cm$^{-2}$. This indicates that fluorine is contained, at least to some extent, in the entirety of the tunnel insulating films 43 and 44. This enables improving the reliability of the memory cell film 40. Furthermore, as shown in FIG. 8, in some embodiments, an amount of decrease in the average concentration of fluorine at an interface between the tunnel insulating film 43 and charge storing film 42, relative to the average concentration of fluorine at the interface between the tunnel insulating film 44 and the channel 45, is less than a greatest amount of decrease in the average concentration of fluorine in the channel 45, relative to the average concentration of fluorine at the interface between the tunnel insulating film 44 and the channel 45.

Second Embodiment

Figure 9:
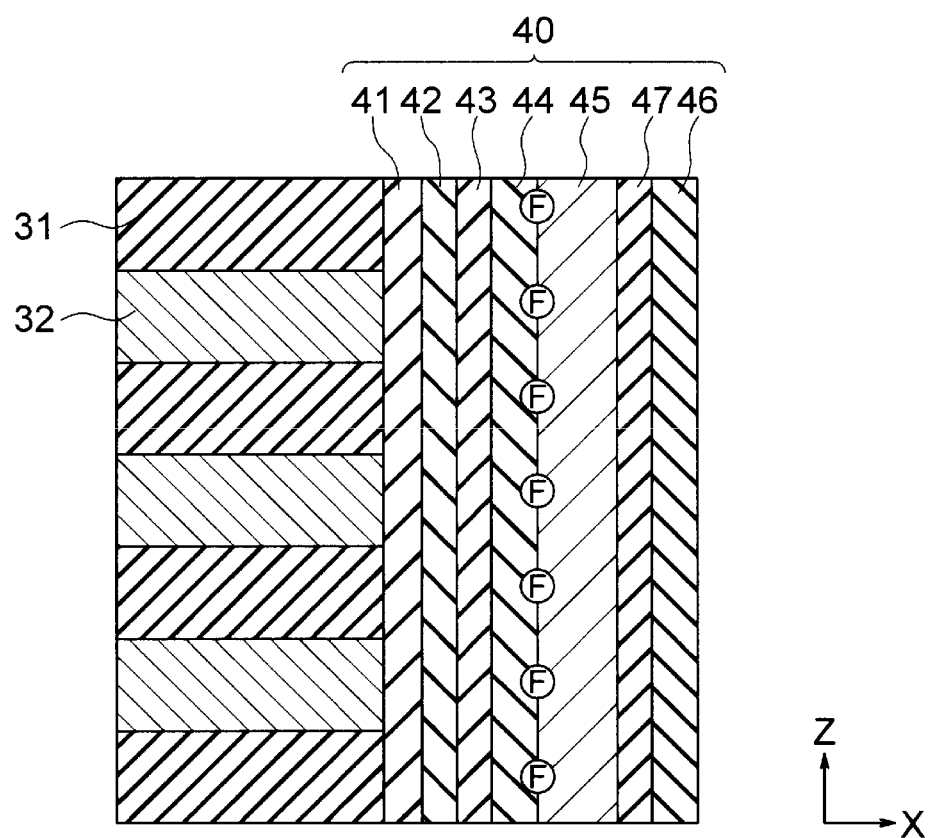
FIG. 9 is a sectional view showing a portion of a memory cell film in a semiconductor device according to a second embodiment.

FIG. 9 is a sectional view showing a portion of the memory cell film 40 in a semiconductor device according to a second embodiment. Constituent elements similar to those of the first embodiment are assigned the respective same reference characters, and the detailed description thereof is omitted.

In the memory cell film 40 illustrated in FIG. 9, a cap film 47 is provided between the channel 45 and the core 46. The cap film 47 is an example of a fifth film, and the core 46 is an example of a sixth film. The cap film 47 includes, for example, a silicon oxide film.

Figure 10:
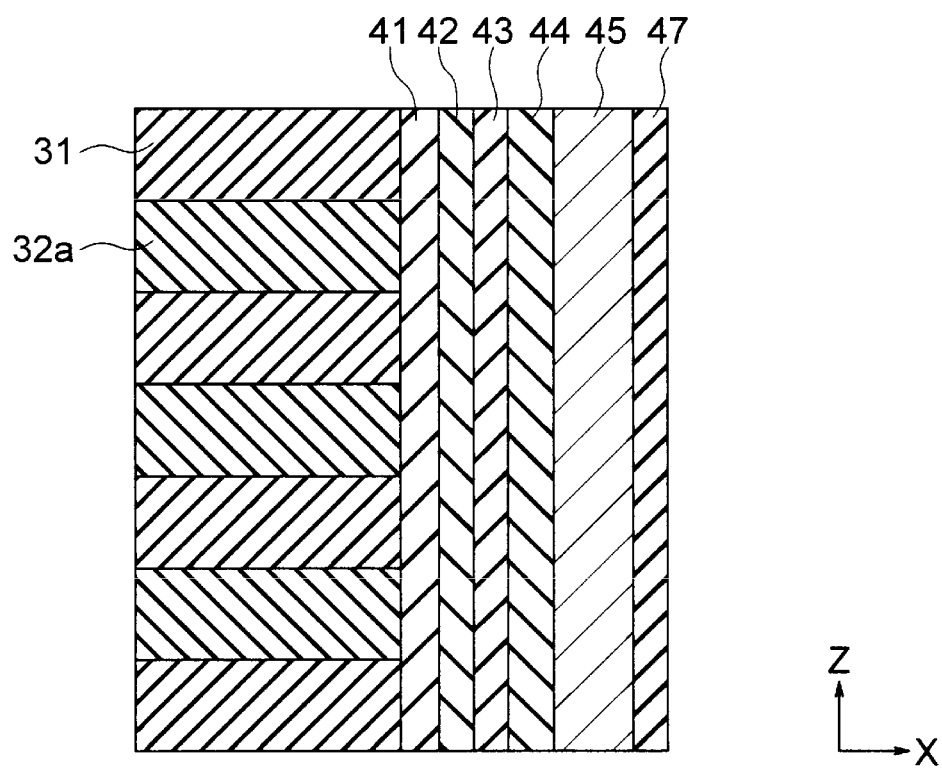
FIG. 10 is a sectional view illustrating a portion of a formation process for a memory cell film according to some embodiments.

Hereinafter, a method for manufacturing the semiconductor device according to the present embodiment is described with reference to FIG. 10 to FIG. 12. In the present embodiment, since the stacked body 30a and the memory hole 50 are formed by a method similar to that of the first embodiment, the manufacturing method therefor is omitted from description, and the method for manufacturing the memory cell film 40 is described.

In the first embodiment, after forming the tunnel insulating film 44 and before forming the channel 45, the method includes performing an annealing treatment using the gas 100 containing fluorine (see FIG. 6). In the present embodiment, as illustrated in FIG. 10, subsequent to the formation of the tunnel insulating film 44, the method sequentially forms the channel 45 and the cap film 47 inside the memory hole 50. The cap film 47 is formed with use of, for example, a low-temperature ALD method.

Figure 11:
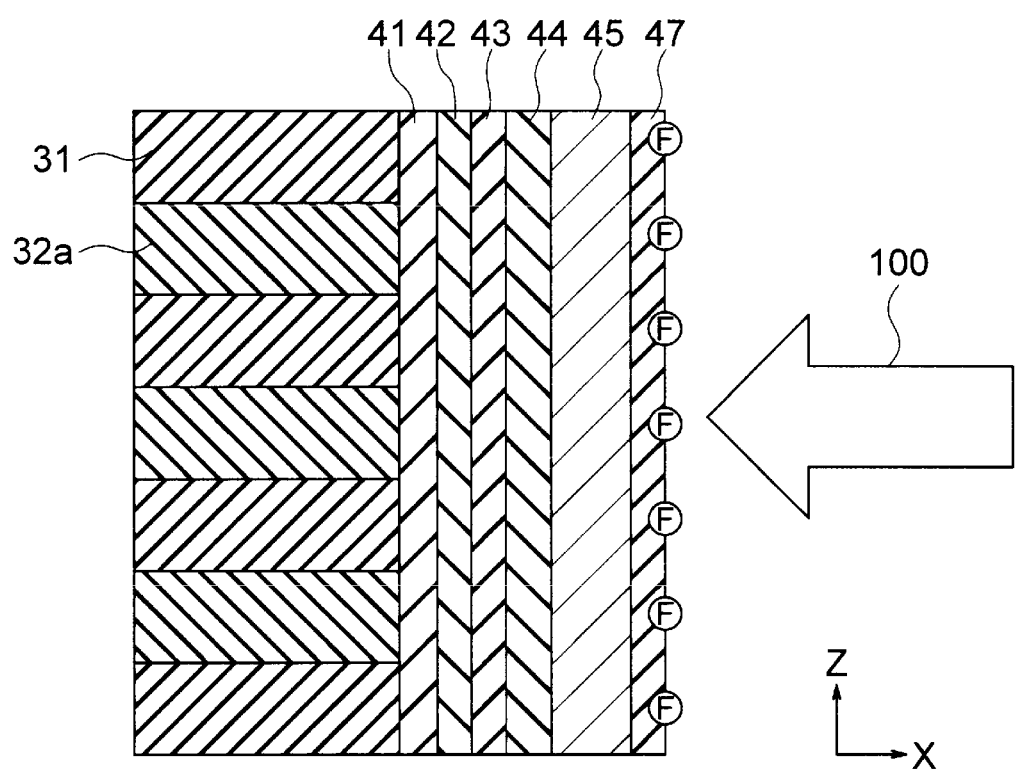
FIG. 11 is a sectional view illustrating an annealing treatment according to some embodiments.
Figure 12:
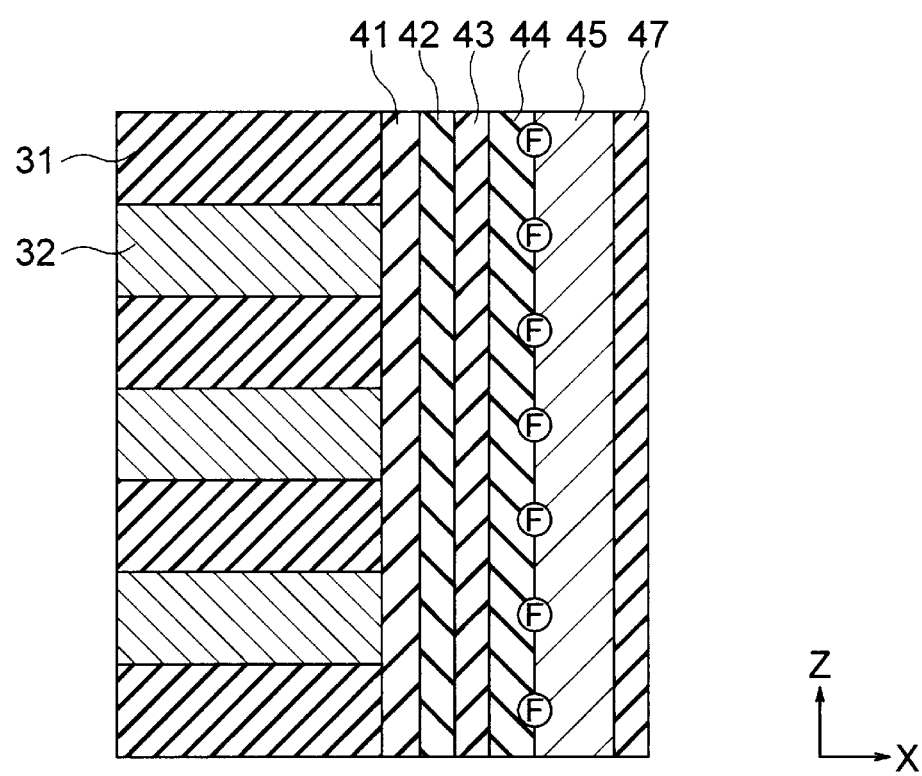
FIG. 12 is a sectional view illustrating rapid thermal anneal (RTA) processing according to some embodiments.

Next, as illustrated in FIG. 11, the method includes performing an annealing treatment using the gas 100 on the cap film 47. This annealing treatment causes the cap film 47 to be altered to a film containing fluorine atoms (in a fairly even distribution), the average concentration per unit area of which is about $(1\times10^{21})^{2/3}$ cm$^{-2}$. Moreover, during this annealing treatment, fluorine is also introduced into the channel 45 via the cap film 47. As a result, the channel 45 has a concentration profile of fluorine in a range of about $(1\times10^{20})^{2/3}$ cm$^{-2}$ to $(5\times10^{17})^{2/3}$ cm$^{-2}$ from the surface side thereof.

Next, the method includes performing rapid thermal anneal (RTA) processing. This processing causes fluorine to be dispersed from the cap film 47 to an interface between the channel 45 and the tunnel insulating film 44, as illustrated in FIG. 12.

Next, the method includes forming the core 46 on the surface of the cap film 47 to achieve the semiconductor device shown in FIG. 9. The core 46 is formed at a film formation temperature higher than the film formation temperature of the cap film 47. Furthermore, the method may include forming the core 46 on the surface of the channel 45 after removing the cap film 47. After that, similar to the first embodiment, the insulating layers 32a are replaced by the conductive layers 32.

Figure 13:
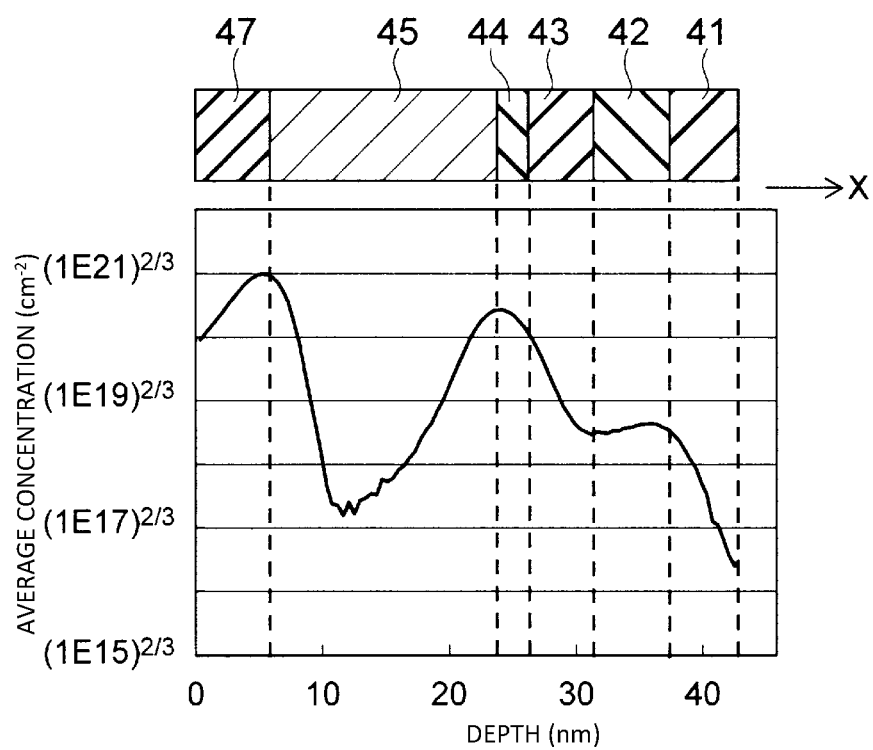
FIG. 13 is a graph illustrating a concentration profile of fluorine in a memory cell film according to some embodiments.

FIG. 13 is a graph illustrating a concentration profile of fluorine in the memory cell film 40 in the present embodiment. In FIG. 13, the horizontal axis indicates the depth in the X-direction from the cap film 47 in nanometers, and the vertical axis indicates an average concentration of fluorine per unit area (per centimeter squared). Moreover, this concentration profile was obtained by performing an annealing treatment in which a gas containing fluorine was introduced for 10 minutes at a temperature of 550° C.

As illustrated in FIG. 13, in the present embodiment, similar to the first embodiment illustrated in FIG. 8, the average concentration of fluorine becomes higher as the depth comes closer to an interface between the tunnel insulating film 44 and the channel 45. In other words, the concentration of defect termination elements at this interface becomes high. This prevents or reduces an increase in channel resistance, and, therefore, enables ameliorating a decrease in electron mobility in the channel 45.

Third Embodiment

In the semiconductor device of the first and second embodiments, the case where fluorine is included as a defect termination element has been described as an example. The present third embodiment describes a case including chlorine as a defect termination element, by way of example.

Figure 14:
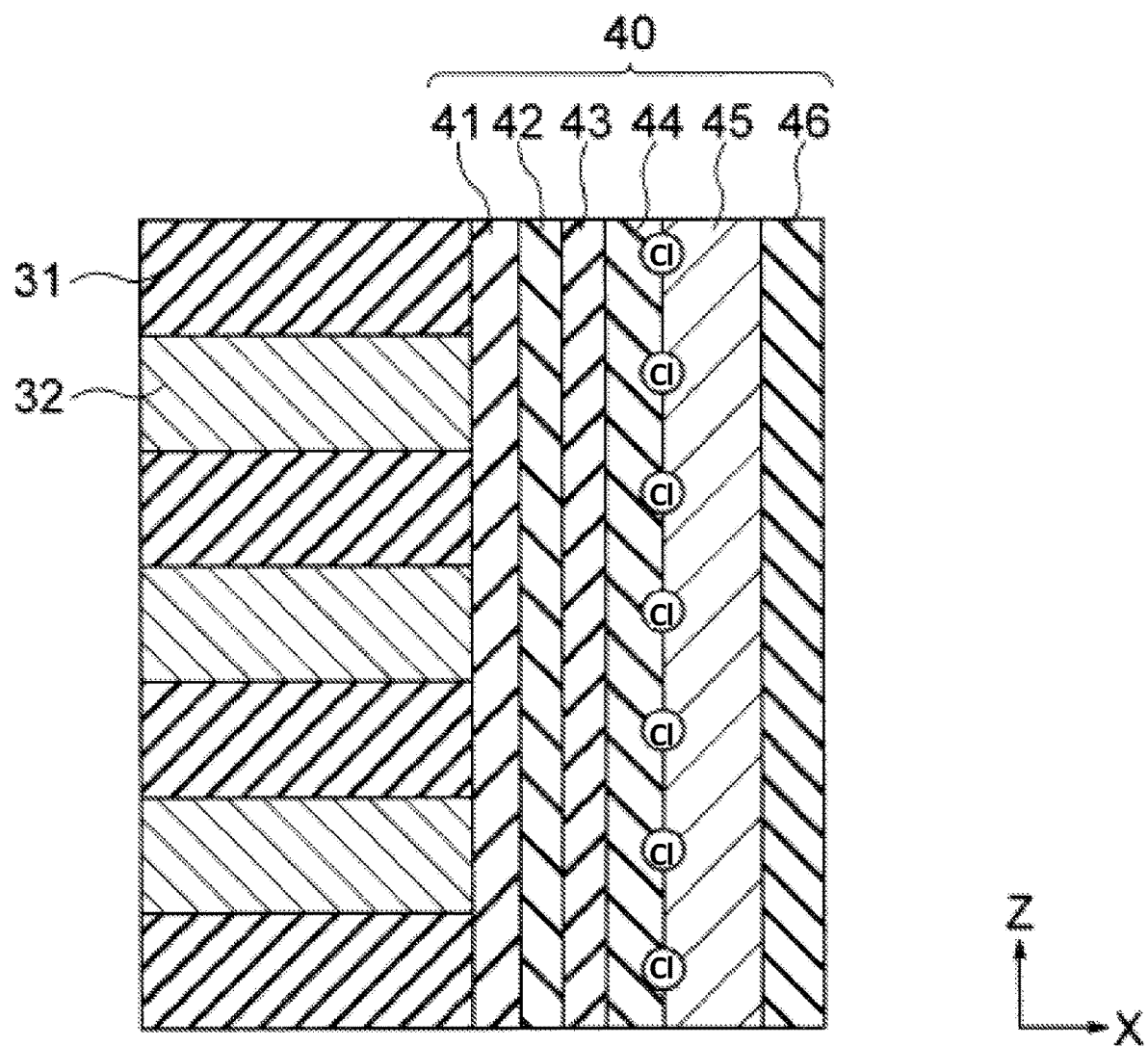
FIG. 14 is a sectional view showing a portion of a memory cell film in a semiconductor device according to a third embodiment.

As shown in FIG. 14, the semiconductor device of the present embodiment includes chlorine (Cl) as a defect termination element at least at the interface between the channel 45 and the tunnel insulating film 44. Chlorine is not limited to the interface between the channel 45 and the tunnel insulating film 44, and may be present, for example, in the vicinity of the interface. Other configurations of the present embodiment may be similar to those of the first embodiment, and explicit description thereof will be omitted.

In the present embodiment, chlorine atoms are bonded to dangling or available bonds of silicon atoms as a defect termination element, and the semiconductor device of the present embodiment thus has a chemically stable structure.

Thus, as in the first embodiment, the reliability of the memory cell film 40 can be improved.

Figure 15A:
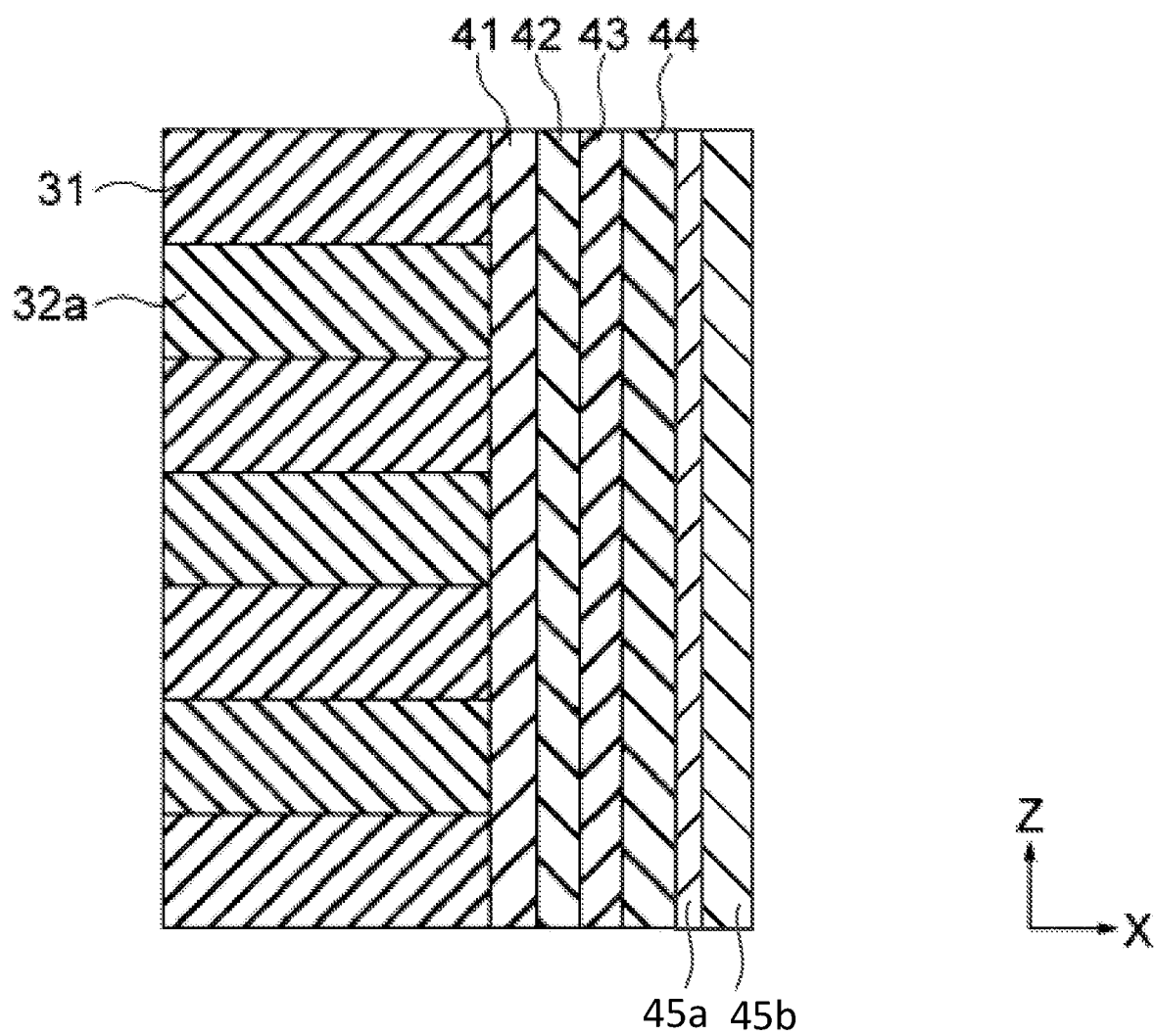
FIG. 15A is a sectional view illustrating a portion of a formation process for a memory cell film according to some embodiments.
Figure 15B:
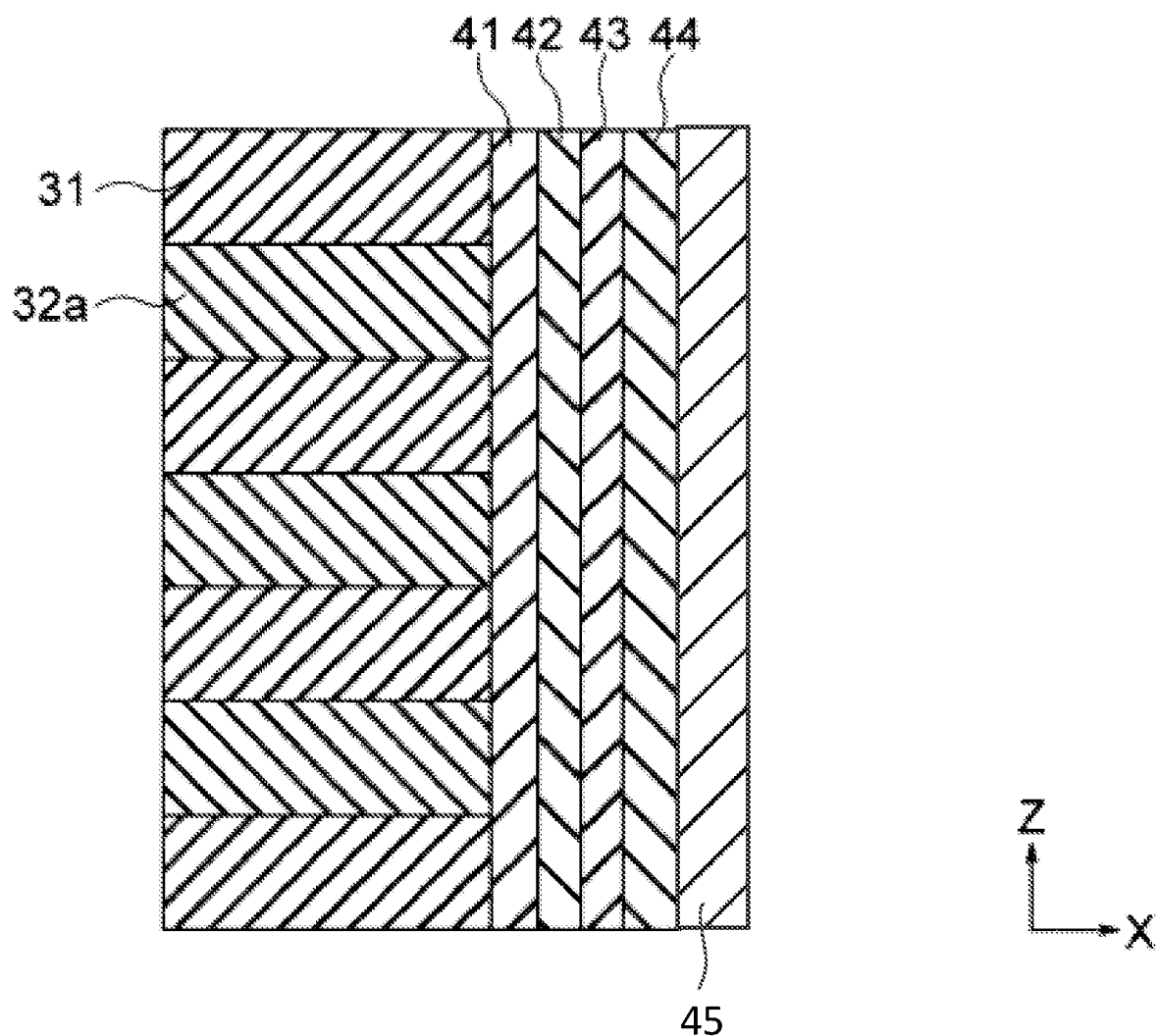
FIG. 15B is a sectional view illustrating a portion of a formation process for a memory cell film according to some embodiments.

Next, a method for manufacturing the semiconductor device of the present embodiment will be described with reference to FIGS. 15 and 16. First, similarly to the first embodiment, the block film 41, the charge storage layer 42, and the tunnel insulating films 43 and 44 are sequentially formed in the memory hole 50 (see FIGS. 3 to 5). Next, as shown in FIG. 15A, monosilane ($SiH_4$) gas and dichlorosilane ($SiCl_2H_2$) gas are simultaneously supplied onto the surface of the tunnel insulating film 44 which is exposed in the memory hole 50, thereby forming an amorphous silicon layer 45a including chlorine atoms. Then, monosilane gas is supplied onto the surface of the amorphous silicon layer 45a to form an amorphous silicon layer 45b. Thereafter, by annealing the amorphous silicon layers 45a and 45b, the amorphous silicon layers are crystallized to form a channel 45 which can include a polysilicon layer (FIG. 15B). In some implementations, about ($1 \times 10^{21}$) chlorine atoms $cm^{-3}$ are disposed at the interface between the tunnel insulating film 44 and the channel 45. Thereafter, similarly to the first embodiment, the core 46 is formed on the surface of the channel 45.

Figure 16A:
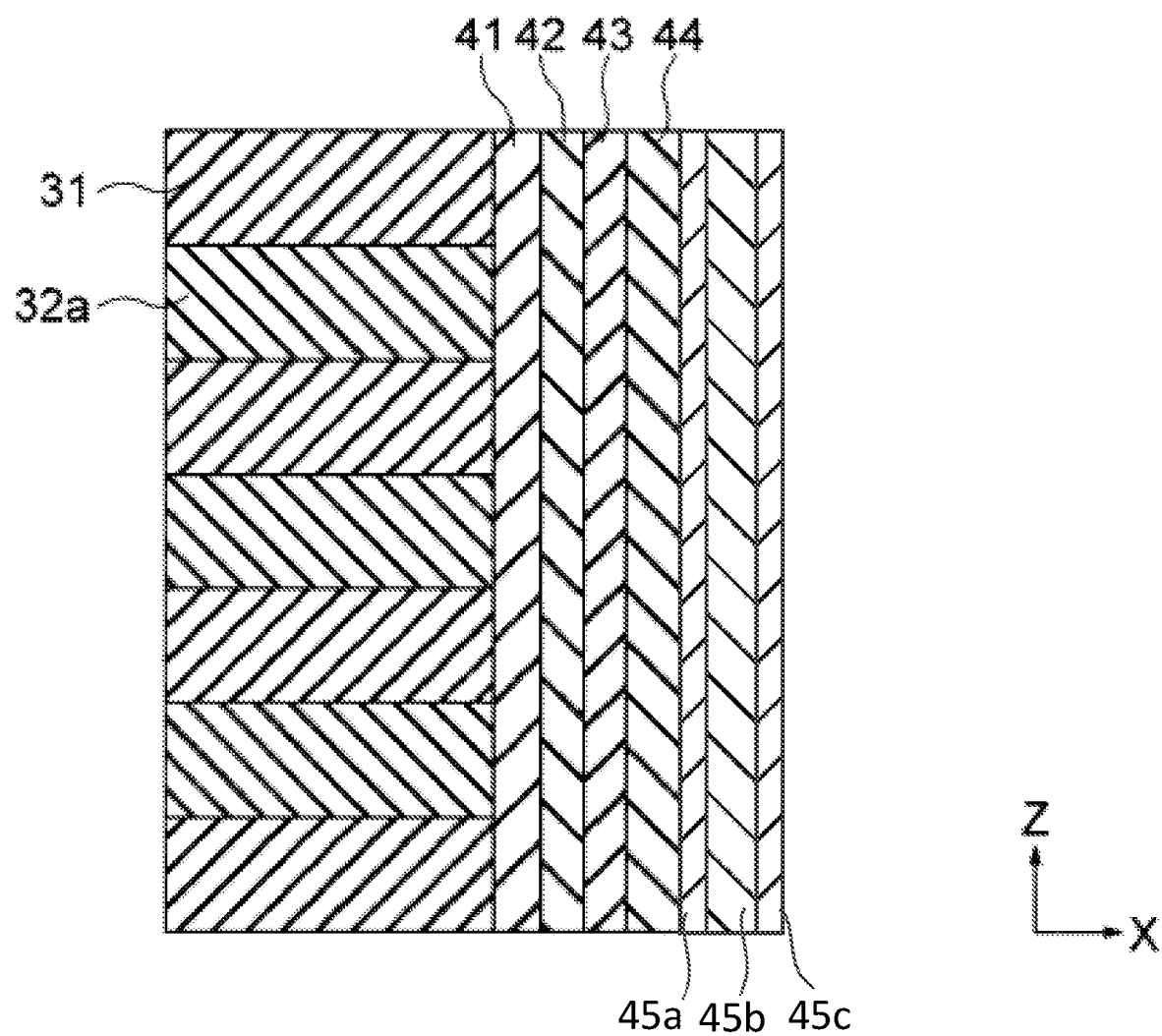
FIG. 16A is a sectional view illustrating a portion of a formation process for a memory cell film according to some embodiments.

As a second example manufacturing method of the channel 45 of the present embodiment, as shown in FIG. 16A, monosilane ($SiH_4$) gas and dichlorosilane ($SiCl_2H_2$) gas are supplied simultaneously after formation of the amorphous silicon layers 45a and 45b, thereby forming an amorphous silicon layer 45c containing chlorine atoms.

Figure 16B:
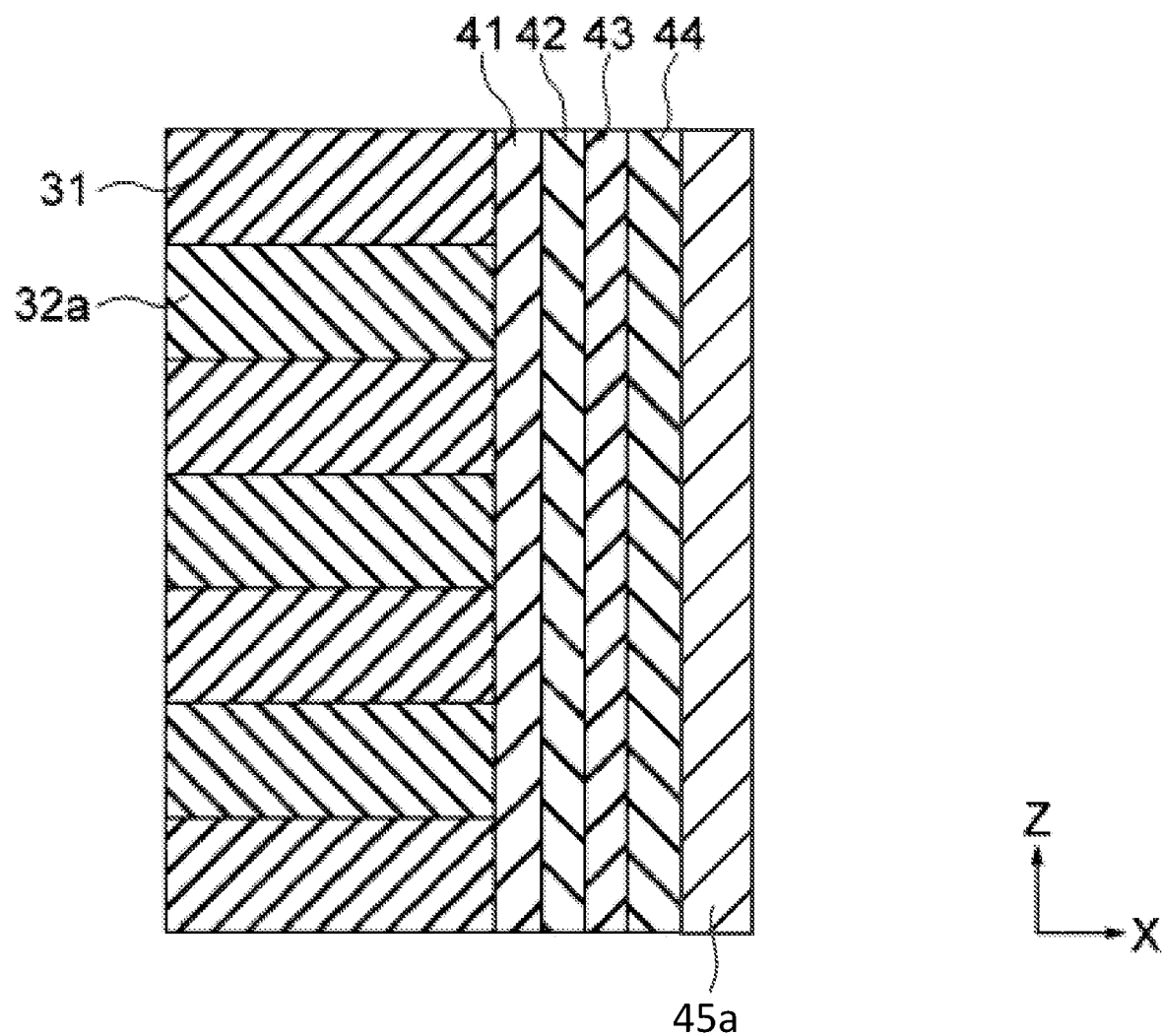
FIG. 16B is a sectional view illustrating a portion of a formation process for a memory cell film according to some embodiments.

As a third example manufacturing method, as shown in FIG. 16B, the amorphous silicon layer 45b may be omitted and the amorphous silicon layer 45b may include the amorphous silicon layer 45a having a specified film thickness.

As a fourth example manufacturing method, the film thickness of the channel 45 may be controlled by implementing a thinning process such as wet etching or the like after forming the channel 45 and before forming the core 46. As a result, it is possible to thin the channel while maintaining a specified the crystal grain size.

According to the method of manufacturing a semiconductor device according to the present embodiment, it is possible to perform segregation of chlorine atoms during formation of a channel or during a same manufacturing process as used for formation of the channel. This can reduce a number of manufacturing steps as compared to certain implementations that introduce a defect termination element via an additional manufacturing step (e.g., as is the case in certain example implementations described herein in reference to the first and second embodiments).

As used herein, the terms "about" and "substantially" are used to describe and account for small variations. When used in conjunction with an event or circumstance, the terms "about" and "substantially" can refer to instances in which the event or circumstance occurs precisely as well as instances in which the event or circumstance occurs to a close approximation. For example, when used in conjunction with a numerical value, the terms "about" and "substantially" can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

While certain embodiments have been described, these embodiments have been presented by way of example only, and are not intended to limit the scope of the present disclosure. Indeed, the embodiments described herein may be embodied in a variety of other forms; furthermore, various omissions, substitutions and changes in the form of the embodiments described herein may be made without departing from the spirit of the present disclosure. The accompanying claims and their equivalents are intended to cover such forms or modifications as would fall within the scope and spirit of the present disclosure.

What is claimed is:

1. A semiconductor device comprising:
   a stacked body including insulating layers and conductive layers that are alternately stacked in a first direction;
   a semiconductor film penetrating through the stacked body;
   a first insulating film provided along the semiconductor film;
   a charge storage film provided along the first insulating film; and
   a second insulating film provided along the charge storage film,
   wherein the semiconductor film and the first insulating film each include a halogen element,
   wherein a concentration of a halogen element in the semiconductor film and the first insulating film is lower than a concentration of the halogen element at an interface between the semiconductor film and the first insulating film,
   wherein an amount of decrease of the concentration of the halogen element in a direction from the interface to the charge storage film is smaller than an amount of decrease of the concentration of the halogen element in a direction from the interface to the semiconductor film.

2. The semiconductor device according to claim 1, wherein decrease of the concentration of the halogen element is within 5 nanometers (nm) to 15 nm from the interface.

3. The semiconductor device according to claim 1, wherein a concentration of the halogen element at an interface between the first insulating film and the charge storage film is smaller than the concentration of the halogen element at the interface between the first insulating film and the semiconductor film.

4. The semiconductor device according to claim 1, wherein the halogen element includes fluorine or chlorine.

5. The semiconductor device according to claim 1, further comprising:
   a third insulating film provided along the semiconductor film; and
   a fourth insulating film provided along the third insulating film.

6. The semiconductor device according to claim 1,
   wherein the second insulating film is a silicon oxide film,
   wherein the charge storage film is a silicon nitride film,
   wherein the first insulating film includes a silicon oxynitride film and a silicon oxide film, and
   wherein the semiconductor film is a polysilicon film.

7. The semiconductor device according to claim 1,
   wherein the charge storage film includes the halogen element, and
   wherein a concentration of the halogen element in the charge storage film is lower than a concentration of the halogen element in the first insulating film.

8. The semiconductor device according to claim 1,
   wherein the concentration of the halogen element in the first insulating film is more than $1 \times 10^{20})^{2/3}$ $cm^{-2}$.

9. A semiconductor device comprising:
a stacked body including insulating layers and conductive layers that are alternately stacked in a first direction;
a semiconductor film penetrating through the stacked body in the first direction;
a first insulating film provided on a surface of the semiconductor film;
a charge storage film provided on the first insulating film; and
a second insulating film provided on the charge storage film,
wherein the semiconductor film and the first insulating film each include a halogen element,
wherein a concentration of a halogen element in the semiconductor film and the first insulating film is lower than a concentration of the halogen element at an interface between the semiconductor film and the first insulating film, and
wherein a concentration of the halogen element at an interface between the first insulating film and the charge storage film is smaller than the concentration of the halogen element at the interface between the first insulating film and the semiconductor film.

* * * * *